United States Patent [19]
Sudoh et al.

[11] Patent Number: 6,144,504
[45] Date of Patent: Nov. 7, 2000

[54] PROJECTION AND EXPOSURE APPARATUS INCLUDING AN OPTICAL MEMBER AND A HOLDING MEMBER

[75] Inventors: Yuji Sudoh, Hadano; Masao Kosugi, Yokohama; Ryuichi Ebinuma, Tokyo, all of Japan

[73] Assignee: Canon Kabushiki Kaisha, Tokyo, Japan

[21] Appl. No.: 09/239,784

[22] Filed: Jan. 29, 1999

[30] Foreign Application Priority Data

Jan. 29, 1998 [JP] Japan .................................. 10-016865

[51] Int. Cl.[7] ........................................................ G02B 7/02
[52] U.S. Cl. ............................ 359/811; 359/813; 359/819
[58] Field of Search ...................................... 359/811, 819, 359/649, 633, 726, 730, 754, 784, 813, 818, 822, 823

[56] References Cited

U.S. PATENT DOCUMENTS

| | | | |
|---|---|---|---|
| 4,778,253 | 10/1988 | Siga et al. | 359/819 |
| 5,822,133 | 10/1998 | Mizuno et al. | 359/696 |
| 6,043,863 | 3/2000 | Ikeda | 355/53 |

*Primary Examiner*—Georgia Epps
*Assistant Examiner*—David Seyrafi
*Attorney, Agent, or Firm*—Fitzpatrick, Cella, Harper & Scinto

[57] ABSTRACT

A projection and exposure apparatus includes an optical member, a holding member for holding the optical member with a gap between the optical member and the holding member, and a powder charged in the gap between the optical member and the holding member, such that the optical member and the holding member are maintained in a spaced-apart relationship.

16 Claims, 10 Drawing Sheets

PROJECTION AND EXPOSURE APPARATUS INCLUDING AN OPTICAL MEMBER AND A HOLDING MEMBER

BACKGROUND OF THE INVENTION

1. Field of the Invention

The present invention relates to a method and an apparatus for holding an optical member and the like with great accuracy, which are suitable for holding a projection lens for use in a semiconductor pattern exposure system, for example.

2. Description of the Related Art

Since a projection lens in a semiconductor pattern exposure system is required to have a high resolving power, the accuracy in holding the lens also must be high. The projection lens typically has a great NA (numerical aperture) in order to obtain a high resolving power. Further, in order to expose and transfer a pattern being equivalent to one chip to several chips in one exposure shot, the lens must have a considerably large image-plane size. Therefore, the projection lens is generally formed by a combination of 20 to 30 single lenses to reduce, to the utmost limits, aberration, such as chromatic aberration, distortion, curvature of the field, astigmatism, and coma.

In the computerized, contemporary world, an optical design is performed to make the above-mentioned aberration fall in the range of a targeted tolerance by appropriately changing the spherical shape of each lens, the thickness of each lens, and the spacing between individual lenses. The manufacturing of a spherical surface on individual lenses is conventionally performed by lapping with a so-called lapping dish face-by-face. After both surfaces of the lens have been worked, the outer peripheral surface of the lens is polished so as to be axially aligned with a straight line connecting the centers of two spherical surfaces (i.e., an optical axis).

On the other hand, in the design and manufacture of a lens barrel, the manufacturing precision will depend on how efficiently the position and spacing of each individual lens is maintained according to the design. The performance of a finished lens is identified by residual aberration in the optical design and the manufacturing error.

Figure 11:
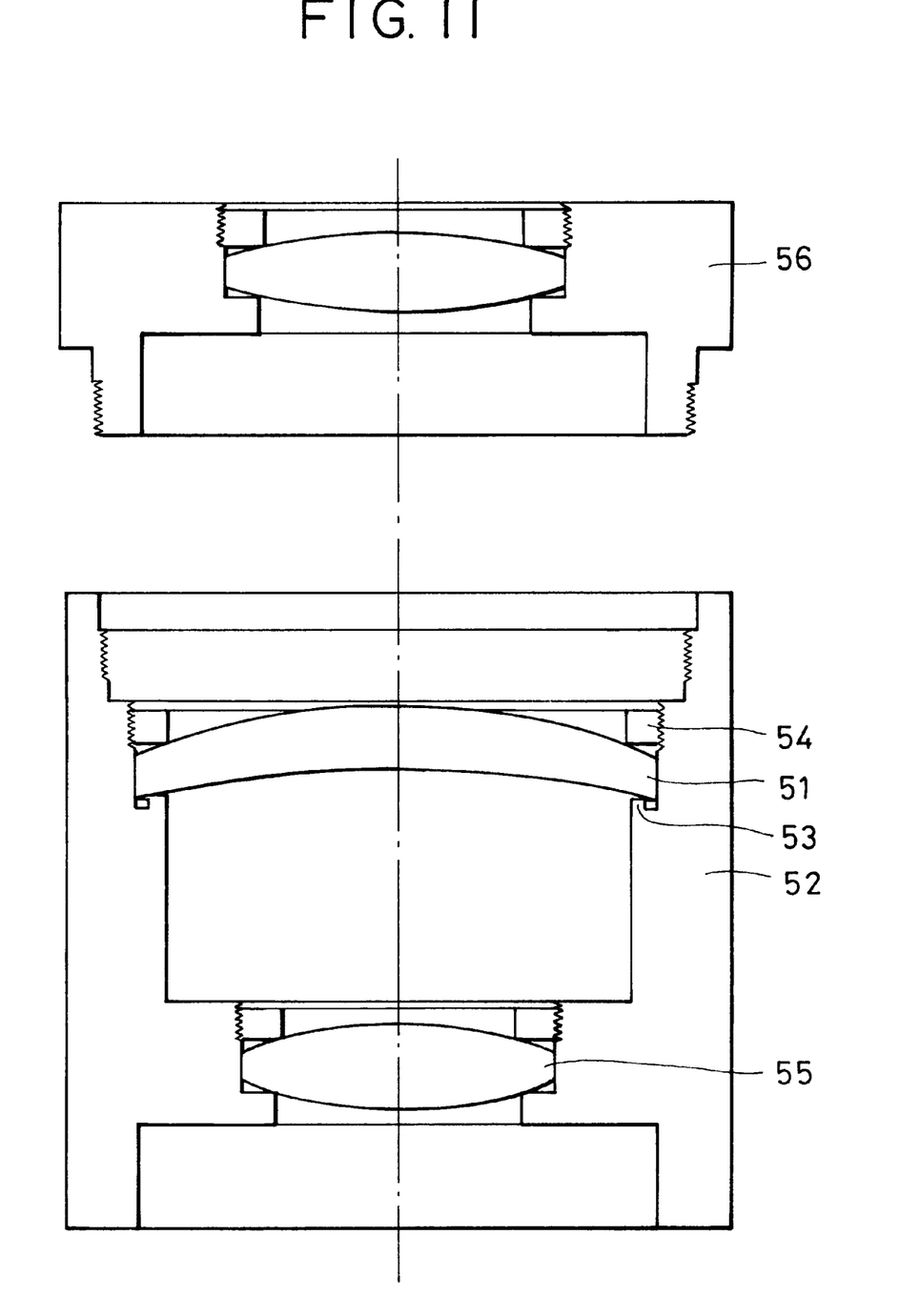
FIG. 11 is a schematic representation of a conventional lens barrel.

FIG. 11 illustrates an arrangement for holding a lens (i.e., a lens barrel structure) generally used in a projecting lens. In a lens barrel having a comparatively low accuracy, an arrangement in which the outer portion of the lens is fitted and fixed in the inner diameter of the lens barrel is used (this will be called a first system). The body of a barrel 52 is previously manufactured for assembly, as shown in the drawing. When a single lens 51 is inserted in the lens barrel 52, a portion 53 of the lens barrel 52, which will be in contact with one side of the spherical surface of the single lens 51, is called an abutting portion. The abutting portion 53, corresponding to a single lens 51 having a concave bottom surface, has a cylindrical shape with a hook-shaped cross section. Since a cylindrical external diameter portion of a single lens (called a lens edge portion hereinafter) is manufactured by rotating around the line connecting the centers of the top and bottom spherical surfaces (i.e., along an optical axis), when the lens edge portion is fitted in an internal cylindrical portion of the lens barrel, the cylindrical portion is aligned with the optical axis of the single lens. By fastening the convex surface of the other side of the single lens through a cap ring 54 at a predetermined torque, the single lens 51 is fixed to the lens barrel 52, losing a degree of freedom in the directions of six coordinates axes. Another single lens 55 is also fixed in the same way. When an optical system is formed by additional single lenses, another lens barrel 56 is connected to the lens barrel 52 through a fitting portion and a screw portion.

In another system, a single lens is fixed to a metal ring called a cell to be inserted in a lens barrel using the cell as a reference instead of directly fitting the single lens in the lens barrel (this will be called a second system). The single lens and the cell are connected one to one and as methods for connecting them, a cap ring type, caulking, an adhesive method, etc., are known.

This second system has advantages such as (1) unintelligible coordinates, such as two spherical surfaces, can be converted to understandable coordinates for mechanism and assembling, such as thickness and external diameter, (2) after the single lens is fixed to the cell, the cell can be manufactured relative to (or conformed to fit) the single lens, since it is easier to machine metal than glass, (3) single lenses having different diameters can be fitted into a lens barrel having a single internal diameter by being piled together in sequence by connecting single lenses by cells having the same external diameters, and (4) an aerial spacing can be adjusted by adjusting the thickness of a spacer between the cells.

However, the aforementioned first system has the following problems.

(1) When the lens edge portion 53 is fitted to the lens barrel 52, it cannot be smoothly inserted if the external diameter of the cylindrical portion of the single lens is not a little smaller than the internal diameter of the lens barrel 52. In the Japanese Industrial Standard (JIS), the internal and external diameter tolerances are standardized, corresponding to the fitting diameter and the level of fitting. For example, in a 200-mm fitting for a level in which smooth insertion and dismantling are possible, a nominal value of the internal diameter is 0 to 0.046 mm, and the tolerance of the external diameter is defined as 0 to −0.029 mm. In this case, the maximum clearance between the outer diameter and the Inner diameter will be 75 $\mu$m. This value, however, is not sufficient for the requirements for a high resolving lens, demanding an eccentricity of less than 1 $\mu$m (2) One side of the spherical surfaces of the single lens is supported by a peripheral-shaped protruding holding portion of the lens barrel. The protruding holding portion is expected to be in contact with the entire perimeter of the lens spherical surface to hold it equally around the entire perimeter. Therefore, the spherical surface of the single lens is polished with a high accuracy of approximately a quarter to one fiftieth of the wavelength of light to which the lens is exposed. When the surface of the single lens is tentatively assumed to be perfectly spherical, the protruding holding portion must be a perfect circle to be in contact with it around the entire perimeter. The shape of a metal member as shown in FIG. 11, however, cannot be polished and can only be machined with an accuracy of 1 to 0.1 $\mu$m as an upper limit. When a single lens is inserted in a lens barrel in this way, the single lens and the protruding holding portion are supported at several unspecified points. This results in a large deformation, which is asymmetrical with respect to the optical axis.

On the other hand, the aforementioned second system has the following problems. The deformation of a single lens due to poor accuracy of the protruding holding portion of the lens barrel is the same as that of the first system. Since the cell must not be stronger than the lens barrel as understood by the cross-sectional structure, the cell itself may be deformed depending on the supporting method.

Figure 12:
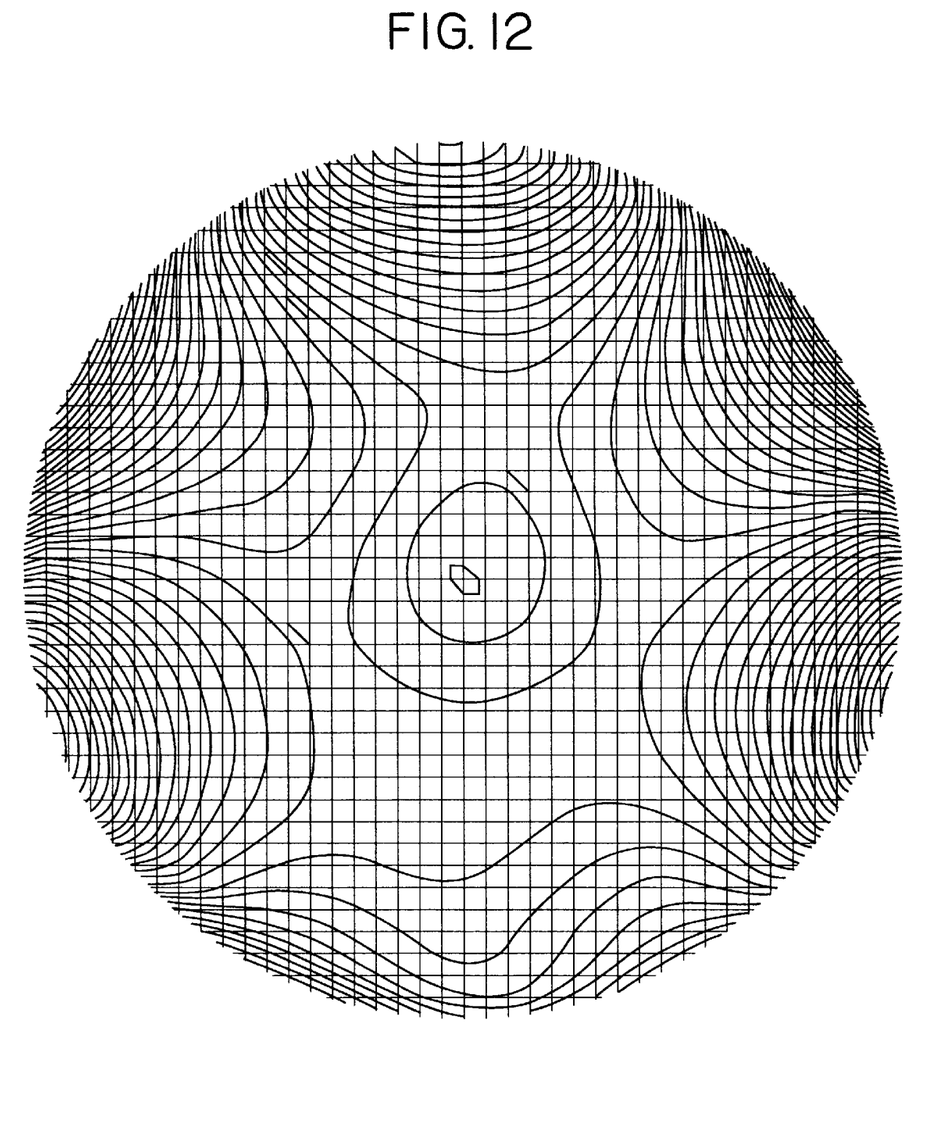
FIG. 12 is a representation showing a measured result of deformation of a single lens caused by the supporting technique.
Figure 13:
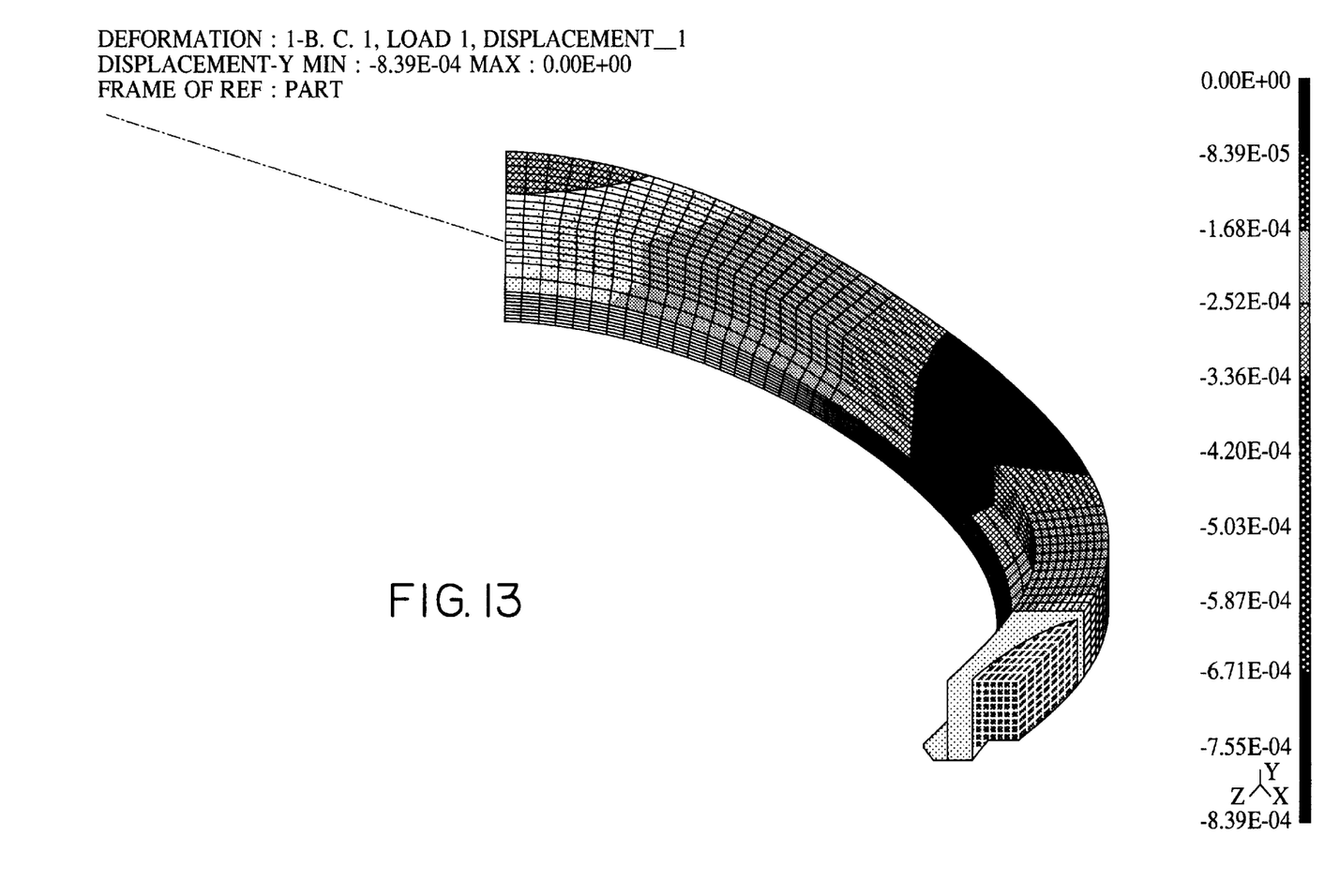
FIG. 13 is a representation showing a simulated result of deformation when a cell is supported at three equally spaced points.

FIG. 12 illustrates a measured result of the deformation of a single lens caused by the supporting technique. From this figure, a contact point between the single lens and the protruding holding portion can be assumed. The maximum displacement in the measured result is approximately 100 nm, which is beyond the tolerance range of the design. FIG. 13 illustrates a simulated result of deformation when the cell is supported at three equally spaced points. This will result in deformation of the abutting portion as well. When the single lens is inserted in this part, it is easily assumed that the lens will be supported at the three points.

SUMMARY OF THE INVENTION

In order to solve the aforementioned problems of the conventional techniques, it is an object of the present invention to provide a new technique of adjusting the position of two members and of fixing them by other than conventional mechanical design techniques such as frictional containment or enclosing containment by a bolt and a nut.

A specific object of the present invention is to provide an optical apparatus and a method for holding members in which holding of the members can be achieved with high-precision accuracy without deforming an optical member such as a lens or a mirror.

A further object of the present invention is to provide a projection and exposure apparatus in which high performance is achieved by utilizing the aforementioned optical apparatus and to provide an excellent production method for a device.

In accordance with one aspect of the present invention, an optical apparatus comprises an optical member, a holding member for holding the optical member with a gap between the optical member and the holding member, and a powder charged in the gap between the optical member and the holding member.

In accordance with another aspect of the present invention, a projection and exposure apparatus comprises an optical projecting system incorporating the aforementioned optical apparatus.

In accordance with still another aspect of the present invention, a method for producing a device comprises the steps of providing the aforementioned projection and exposure apparatus and exposing a substrate to light through the projection and exposure apparatus.

In accordance with yet another aspect of the present invention, a method for fixing a first member and a second member in a predetermined relative position comprises the steps of providing a clearance between the first member and the second member in a desired constraining direction and fixing both the first member and the second member together by charging a powder in the clearance.

DESCRIPTION OF THE PREFERRED EMBODIMENTS

The basic concepts of the present invention will be described first, before describing the embodiments of the present invention.

An optical element such as a single lens can only be supported on a peripheral region, with the exclusion of the effective luminous flux. When a partial portion of the spherical surface of the single lens is supported, because the spherical surface is manufactured with an extremely high accuracy, it is preferable to support the lens on a peripheral portion under uniformly distributed pressure. When a single lens is to be fixed after it is positioned in a cell, a desirable method is that the single lens position is not defined by an abutting portion.

One mode for supporting under uniform pressure is the utilization of fluid (e.g., a gas or liquid). Fluid can characteristically apply a uniform pressure to an enclosed wall, when it is enclosed in a space. Embodiments of this concept include a water pillow and a pneumatic bearing. However, if fluid is utilized, it is difficult to maintain the position of the single lens relative to that of the cell, when interference, such as vibration (caused by acceleration), arises.

Thus, the inventor has paid attention to powder, which is a substance of fine particles (also called grains). Powder is currently defined as "a cluster of fine solid particles, for example, ranging from below 1 mm down to about several nm". Powder is a material in which all solids in the earth can be shaped and some of it can combine liquid-like and solid-like properties. It is a well known phenomenon that sugar or salt can be solidified by humidity while being poured from a container, when the container is inclined. Cement or lime also can be solidified by a chemical reaction when mixed with water. If a powder having a reversible property between liquefaction and solidification can be obtained, it can be repeatedly utilized for adjusting and fixing.

A basic concept of the present invention is a technique for holding a first member and a second member in a predetermined relative position, which comprises providing a clearance between the first member and the second member in a desired constraining direction, and fixing the first member and the second member together by charging a powder into the clearance. When the first member and the second member are an optical member (e.g., a lens, a mirror, etc.) and a member for holding the optical member, respectively, it is a feature of the present invention to charge a powder between these two members.

Since powder simultaneously has the properties of a fluid and a solid, by utilizing these properties, deformation of an optical member as described in the conventional example shown in FIGS. 11 and 12 can be substantially prevented.

First Embodiment

Figure 1:
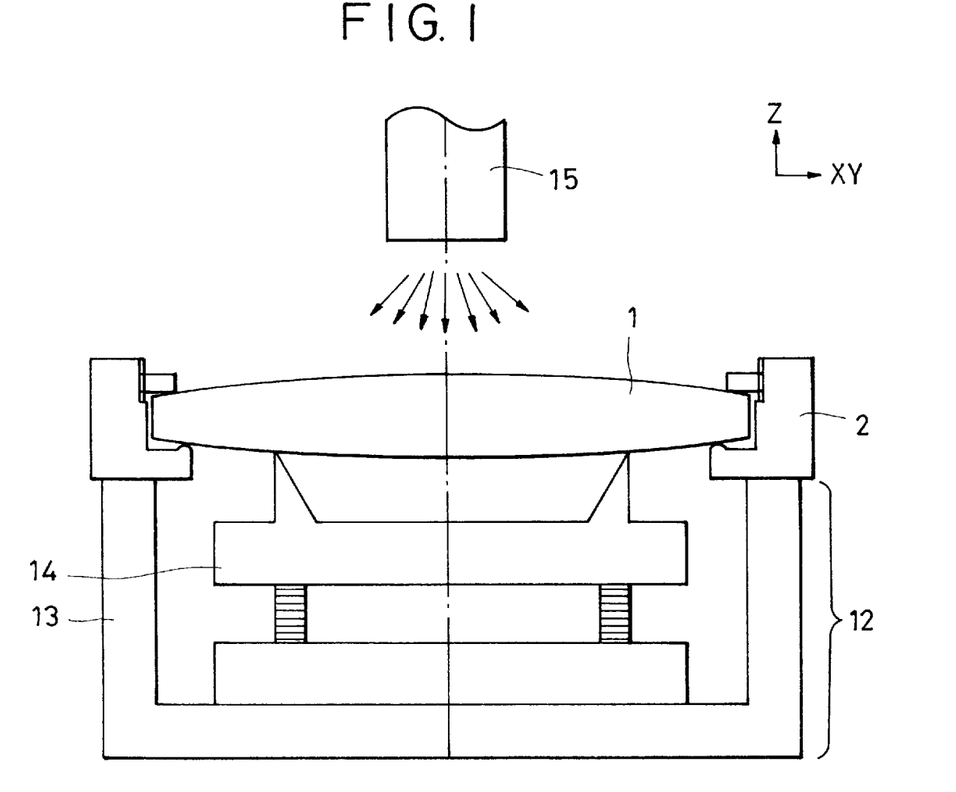
FIG. 1 is a schematic representation of the adjusting and fixing method for a single lens (e.g., a double convex lens supported on an abutting portion) according to a first embodiment of the present invention.

FIG. 1 is a schematic representation according to an embodiment of the present invention in which, for example, an arrangement is shown for positioning a single lens 1 and a cell 2 to hold a projection lens of a semiconductor exposing apparatus by the aforementioned cell system.

In order to support a double convex single lens 1 on a cell 2 with high accuracy, a relative position of the lens 1 and the cell 2 is to be adjusted in six coordinate directions (X, Y, Z, ($\omega$X,$\omega$Y,$\omega$Z) by an adjusting tool 12 including a base 13 supporting the cell 2, and a supporting ring 14 supporting the lens 1.

In FIG. 1, the lens 1 is shifted to be adjusted while the cell 2 is fixed, using driving means (not shown) in the six directions and occasionally measuring means for measuring a driven shift. For example, above the lens 1, an optical eccentricity measuring means 15 is located to measure the centers of the two spherical surfaces of the lens 1.

Figure 2:
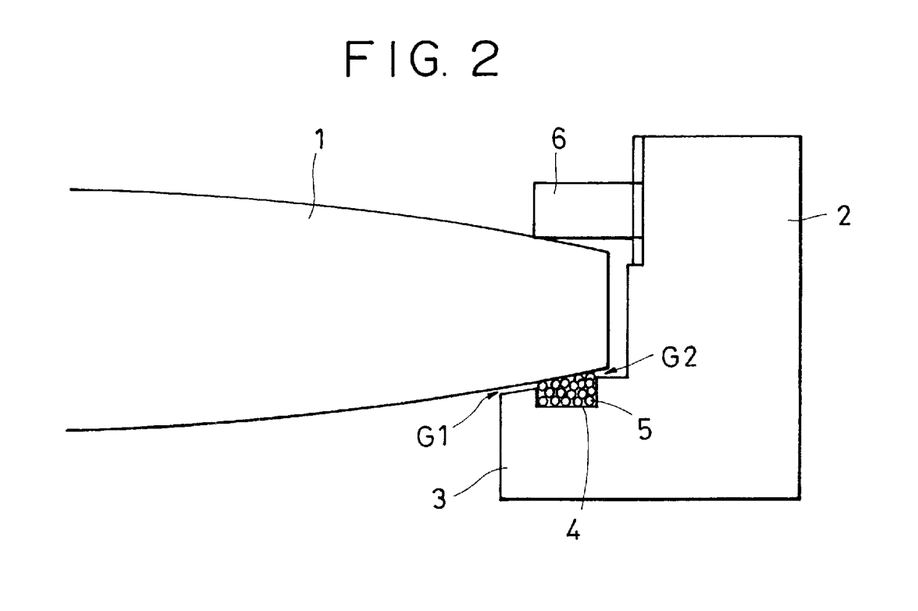
FIG. 2 is a partial, detailed view of the arrangement shown in FIG. 1.

FIG. 2 is an exploded view of a junction portion between the lens 1 and the cell 2. An appendix 3 extends inwardly from a lower part of the cell 2. On the top surface of the appendix 3, a shallow groove 4 is formed in a circular shape to be filled with a powder 5 to support the lens 1.

The bottom surface of the lens 1 is not directly in contact with the appendix 3 of the cell 2. Rather, these elements are separated across a gap G1 and a gap G2, which are microscopic clearances. Assuming that a particle of the powder has a spherical shape of 10 $\mu$m in average diameter, both of the gaps G1 and G2 are designed to be less than 10 $\mu$m.

As for the powder 5, although the lens 1 can be supported on one layer of the particles across a gap of 10 $\mu$m, considering variations of the particle sizes of the powder and manufacturing (machining) accuracy of the groove 4, it is preferable that the layer of the powder 5 be formed by deposition of two or more layers of particles, to obtain an averaging effect, which is an aim of the present invention. Accordingly, the depth of the groove 4 is specifically determined by considering the material and solidity of the powder.

In this state, a relative eccentric adjustment between the lens 1 and the cell 2 is performed by the measuring means 15 and the adjusting tool 12. After this adjustment is finished, the peripheral top surface of the lens 1 is fastened by a cap ring 6 to finish the setting. In this configuration, the problem of "deformation in an abutting portion" which is described with respect to a conventional example is solved by an averaging effect of the powder.

Second Embodiment

In the embodiment shown in FIG. 2, there are possibilities of local deformation arising at the contact point between the lens 1 and the cap ring 6 and a strain in the lens 1 caused by a local stress due to a difference in coefficients of linear expansion between the lens 1 and the cell 2 when the temperature changes. The embodiment shown in FIG. 3 solves this problem by using an adhesive for fixing the lens.

Figure 3:
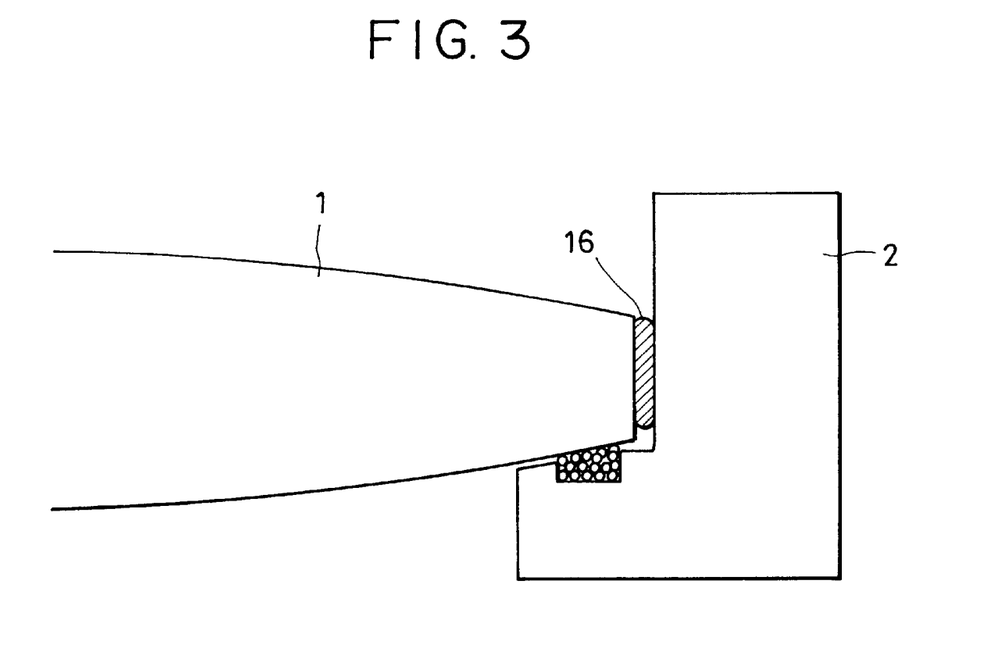
FIG. 3 is a schematic representation of a second embodiment of the present invention.

In FIG. 3, an adhesive 16, which is a soft material, such as a silicone compound, which also has a small contraction when being cured, is disposed around the entire outer periphery of the lens 1, or at a plurality of equally spaced places. By utilizing a slippery material, such as a Teflon-type (Teflon is a trademark) material as the powder, the displacement difference between the lens 1 and the cell 2 when the temperature changes can be absorbed by the adhesive 16 so that the lens 1 may be held with high accuracy.

Third Embodiment

Figure 4:
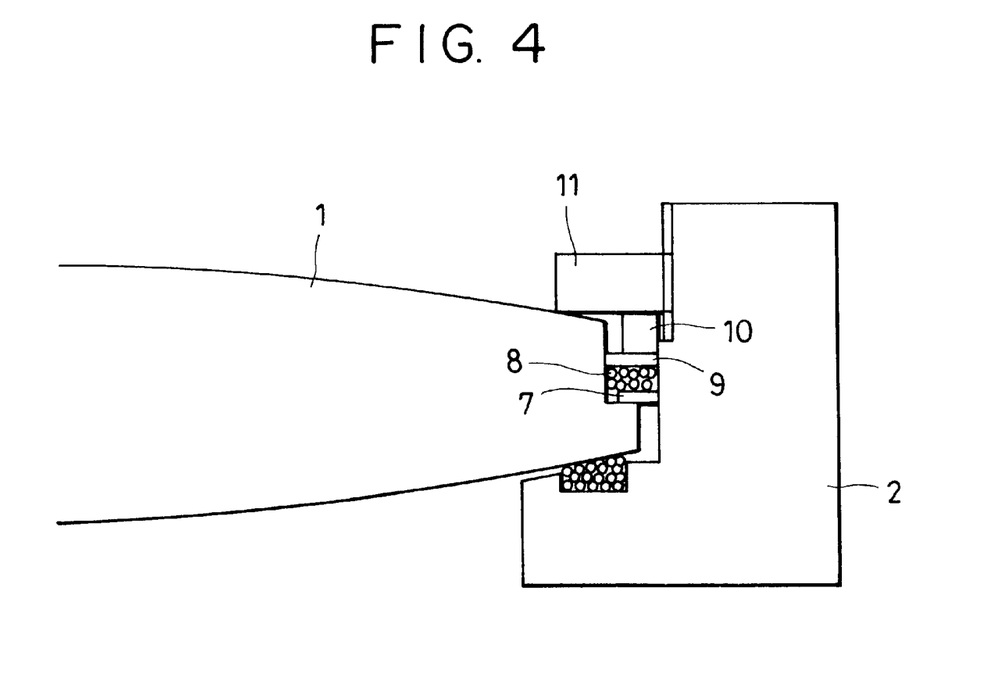
FIG. 4 is a schematic representation of a third embodiment of the present invention.

FIG. 4 illustrates another example in which powder is utilized in the holding portion as well. The abutting portion is the same as that shown in FIG. 2. In this embodiment, however, the upper portion of the outer periphery of the lens 1 is cut off to form a shoulder, onto which a lower sealing ring 7 is dropped, and then a predetermined quantity of powder is charged thereon. An upper sealing ring 9 is dropped onto the powder, and is fixed by a cap ring 11 via a spacer 10. In FIG. 4, since the lens 1 is held by the powder in all six axis directions, mounting of the lens 1 is achieved by the averaging effect of the powder so that the lens 1 is held without any local deformation. Also, since no adhesive is used (unlike the embodiment of FIG. 3), there is also no possibility of strain arising in the lens caused by curing and contraction of the adhesive.

Fourth Embodiment

Figure 5:
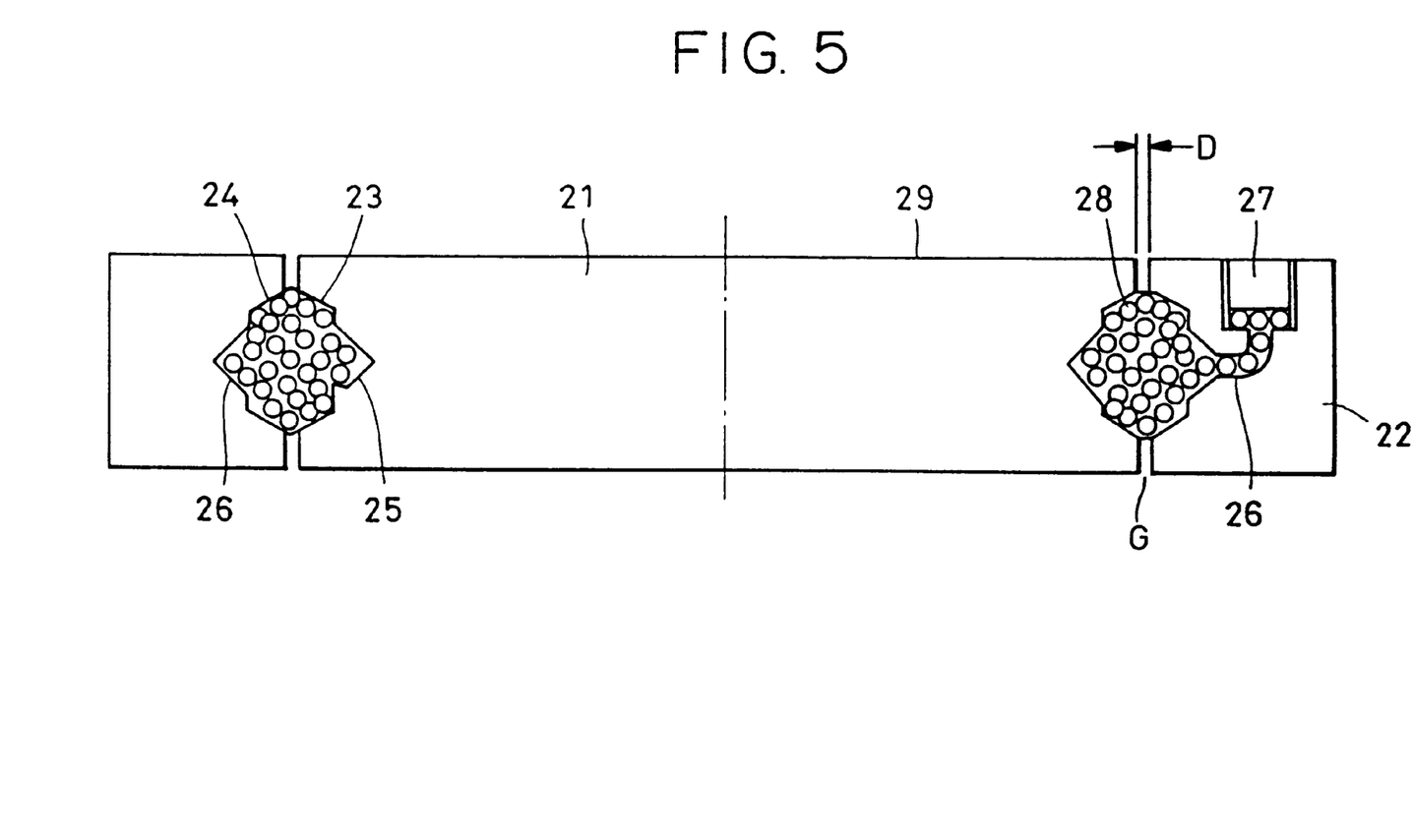
FIG. 5 is a schematic representation of a fourth embodiment of the present invention (in which a cylindrical portion of a mirror is held)

Next, FIG. 5 shows an example of a holding method without the use of an abutting portion. A method will now be described in which a disk 21, being a representation of an optical member such as a lens or a mirror, is held by a ring 22 that engages the disk 21 with a uniform gap in the outer periphery of the disk 21.

As described above, a uniform gap (G on the order of 20 $\mu$m) is formed between the outer periphery of the disk 21 and the inner periphery of the ring 22. Ring-shaped grooves 23 and 24 are formed in the outer periphery of the disk 21 and the inner periphery of the ring 22, respectively. In each of the grooves 23 and 24, a plurality of conical-shaped recesses 25 and 26 (for example, twenty-five each) are formed, being equally divided around the rings of the grooves 23 and 24.

Spherical-particle powder 28 having a particle diameter on the order of 100 $\mu$m, for example, is poured in from a pouring inlet 26. Because of the relation between the gap G (on the order of 20 $\mu$m) and the particle diameter (on the order of 100 $\mu$m) of the powder, the powder cannot fall out from the gap. Generally speaking, the particle diameter should be in a range of from $\Phi$ D/2 to $\Phi$ D, when a diameter difference between the outer periphery of the disk 21 and the inner periphery of the ring 22 is D.

By pouring the powder while applying vibration to the disk 21 and the ring 22, the powder becomes substantially solidified, while the density of the powder is increased by mutual contact of each of the particles. Therefore, the powder becomes compacted. Further, each particle of the powder loses mobility because of the constraint of the other particles and the walls of the disk 21 and the ring 22. After the powder is compacted so that no more powder can be charged, a plug 27 is plugged in the powder inlet. In this state, the disk 21 and the ring 22 lose mobility in all six directions, while being substantially perfectly bound to each other.

Instead of pouring the powder from the pouring inlet 26, the powder can also be poured from an increased clearance, which can be obtained by shifting the ring 22 in one direction relative to the disk 21. After the powder is charged, the disk 21 and the ring 22 are returned in a concentric position and then the powder is solidified. Thereby, the disk and the ring are bound to each other.

This Embodiment is particularly effective, when one side 29 of the disk 21 has a mirror surface, for example, because it is not necessary to cover the mirror surface to hold it.

Fifth Embodiment

Figure 6:
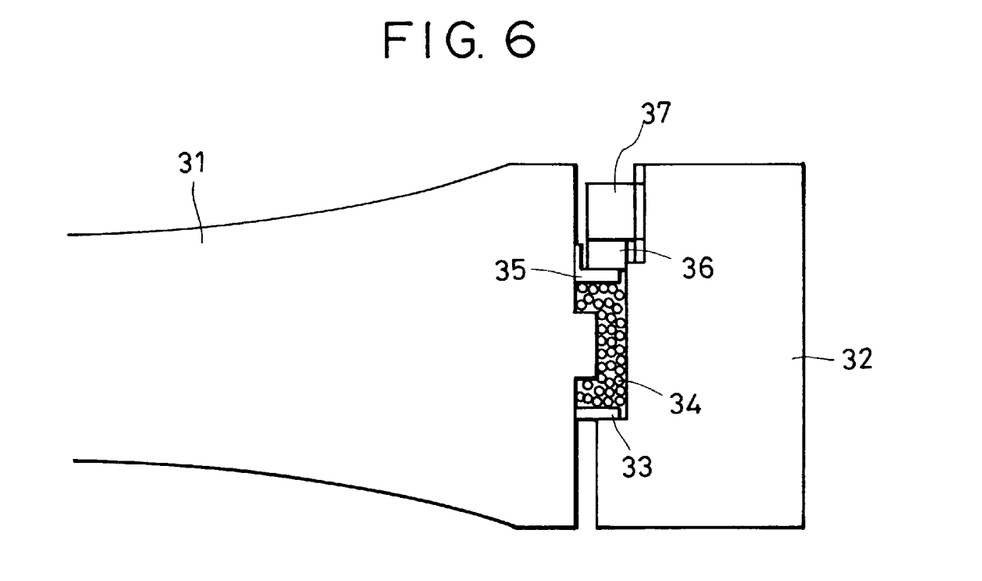
FIG. 6 is a schematic representation of a fifth embodiment of the present invention (in which a cylindrical portion of a double concave lens is held)

FIG. 6 shows another example of holding a lens 31 to a cell 32, using a similar concept as that shown in FIG. 5. This Embodiment describes an example in which the displacement is large in the eccentric adjustment and a gap larger than a particle diameter of the powder is demanded.

In FIG. 6, the upper and the lower portions of the outer cylindrical periphery of the lens 31 are cut off to form shoulders. A lower sealing sheet 33 is disposed in the gap between the lens 31 and the cell 32 so as to substantially block the lower portion of the gap, covering the lower cylindrical portion of the lens 31 and a portion of a shoulder of the cell 32. When it is necessary to flush air for cooling through the clearance between the lens 31 and the cell 32, the sealing sheet 33 may be in the form of a net having a small mesh or a breathing material so as to shut out the powder particles.

Then, a necessary quantity of the powder 34 for charging around the protruding portion of the lens 31 is poured in. An upper sealing sheet 35 covers the powder layer and a keeping ring 36 in turn covers the sealing sheet 35. In this state, after a relative position of the lens 31 and the cell 32 is adjusted, by applying pressure to the powder 34 through a cap ring 37, the lens 31 is fixed to the cell 32 to finish the procedure.

A specific example in which the embodiment shown in FIG. 5 or 6 is utilized in an optical projection system of a semiconductor exposing apparatus will be described. In the optical projection system, there are possibilities that exposure light may be incident not only on the lens but also on the holding portion (peripheral portion) as flare or diffraction light. Therefore, it is preferable that the powder be a material which is not chemically reactive to light. Although an inorganic material is preferable, there may be some organic materials, which are not reactive to some specific light. It is only essential that the choice of the powder depend on the projecting lens. As for the wavelength of the light projected to the projecting lens, light emitted by lamps such as g-line, h-line and i-line is known. On the other hand, an excimer laser has been notable recently because of the use of a single-wavelength in accordance with the miniaturization of semiconductor devices. Since the wavelength of 248 nm of a KrF excimer laser and the wavelength of 193 nm of an ArF excimer laser are so strong that they may destroy the molecular bonds of organic materials, special attention is needed.

As a candidate for the material of the powder, a powder of spherical particles of $SiO_2$ (quartz), which are so-called silica beads, is preferred. The silica beads, which are mainly used as a spacer to make a space for a liquid crystal in a liquid crystal display panel, may be one of the most ideal powder materials for holding a projecting optical system, because errors in sphericity and diameter are maintained within small dimensions. Further excellent mobility is provided due to the spherical shape, and the main material of a deep UV lens is $SiO_2$. When rigidity must be held after adjustment and fixing are specially required, a powder of non-spherical bar-like crystals of $Al_2O_3$ (alumina) and the like is preferred. Since consideration may also be given to a composite material (in which one particle includes two or more materials), a suitable material for a particular use can be selected.

Sixth Embodiment

The aforementioned Embodiments have described methods for substantially solidifying the powder by enclosing the powder in a closed space in which each of the particles loses mobility by being bound to other particles and the walls of the components. In this Embodiment, another solidifying method is provided. A basic holding method is similar in concept to that shown in FIG. 5.

Figure 7:
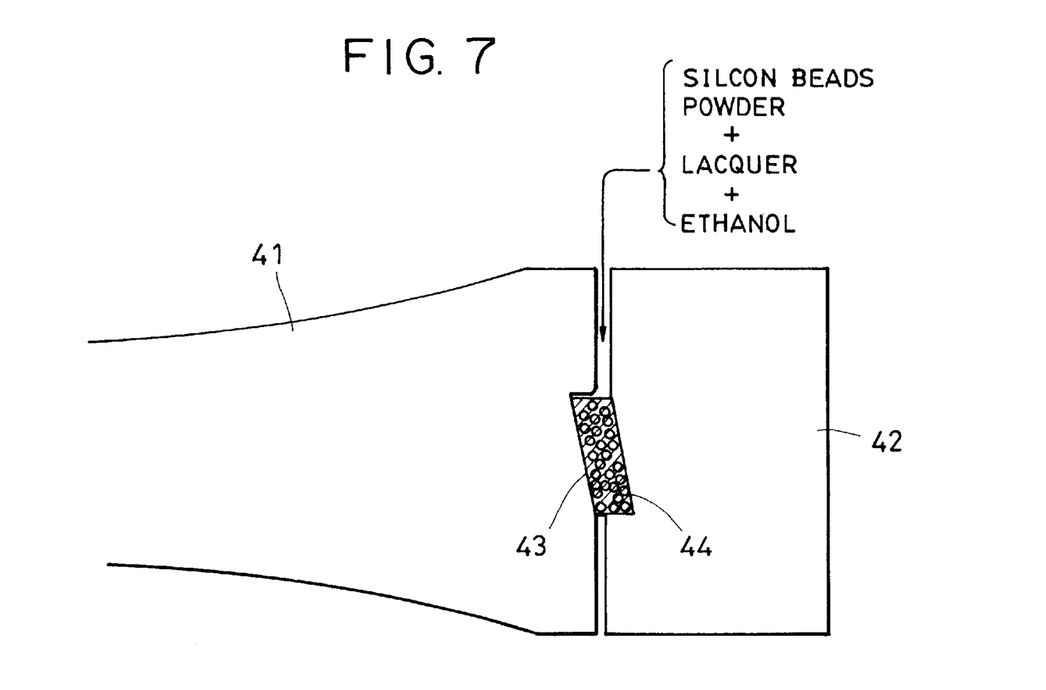
FIG. 7 is a schematic representation of a sixth embodiment of the present invention.

In FIG. 7, a lens 41 and a cell 42 have ring-shaped recesses 43 and 44, respectively, to form a space to charge the powder therein when the lens 41 and the cell 42 are disposed in a predetermined relative position. The lower gap between the lens 41 and the cell 42 is determined so as to be smaller than the diameter of the particles of the powder. In this Embodiment, the upper gap is determined so as to be larger than the diameter of the particles of the powder.

On the other hand, the powder of silica beads is prepared by adding an adhesive material (e.g., lacquer) and a solvent (e.g., ethanol) for dissolving the lacquer to make it a suspension liquid (i.e., a slurry). The slurry is poured in from the upper gap between the lens 41 and the cell 42. At this time, the particles of the powder are trapped in the space formed by the recesses 43 and 44, and most of the liquid flows out of the lower gap while a portion of the liquid remains by sticking to the particles of the powder and the side walls of the lens 41 and the cell 42.

Then, when the ethanol evaporates by natural drying or forced drying, only the silica beads and a small amount of the lacquer remain. The lacquer is thereby thinly coated on the surface of the particles of the powder and the side walls of the lens 41 and the cell 42 to deprive the particles of mobility. This results in solidification of a mass of the particles so as to fix the lens 41 to the cell 42.

In this example, there may be either a case in which an air layer finally remains in the solidified powder (to give permeability) or a case in which the air layer is excluded, to be filled by the lacquer. Either of the cases is effective. Although the latter case seems similar to a case in which an adhesive is simply charged, it is definitely more advantageous than using just adhesive, since the lens is not subjected to any stress in this example, whereas the lens can be deformed by stress when the adhesive is cured and contracted, in the case of using adhesive. Since the particles of the powder are subjected to stress caused by contraction when the powder and the adhesive are mixed, the effect on the lens may be much smaller.

Seventh Embodiment

Figure 8:
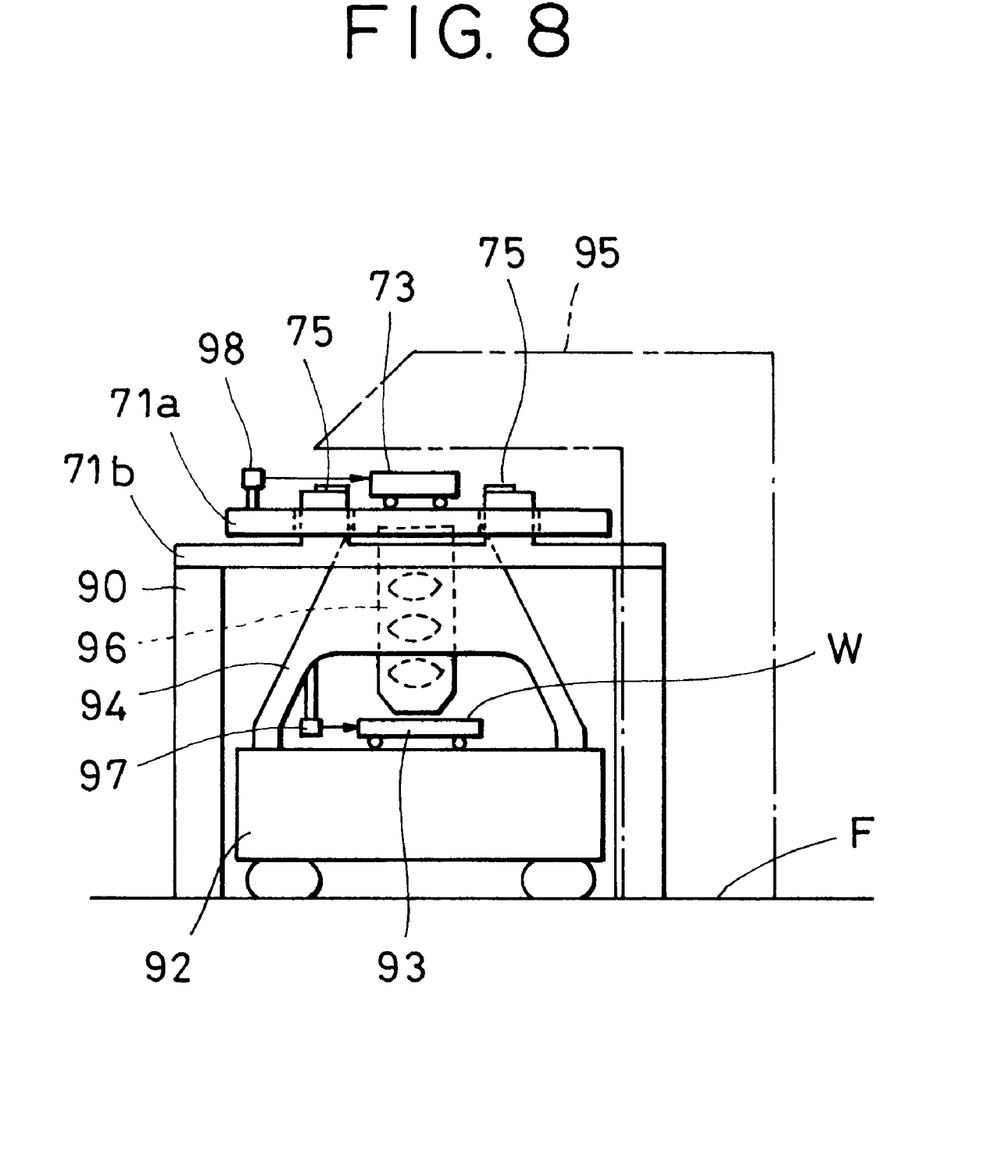
FIG. 8 is a schematic representation of a seventh embodiment of a scanning-type projecting and exposing apparatus of the present invention.

FIG. 8 illustrates an embodiment of a scanning projecting and exposing apparatus (step and scan exposing apparatus) utilizing the aforementioned optical apparutus as a projection system.

A reticle stage base 71A supporting a reticle stage 73 is integral with a frame 94 which stands on a platform 92 supporting a wafer stage 93 of an exposing apparatus, while a linear motor base 71B is supported by a supporting frame 90, which is directly fixed to the floor F, being independent from the platform 92. An excimer laser generator 95 (shown by broken lines) generates exposure light for exposing a wafer W as a substrate on the wafer stage 93 via a reticle on the reticle stage 73.

The frame 94 supports a projecting optical system 96 disposed between the reticle stage 73 and the wafer stage 93, while supporting the reticle stage base 71A. The projecting optical system 96 includes a plurality of single lenses of which at least one single lens is held and fixed by a technique utilizing the powder according to any of the aforementioned embodiments.

Since a stator 75 of a linear motor, which accelerates and decelerates the reticle stage 73, is supported by the supporting frame 90 independent from the frame 94, there is no fear (1) of external disturbance impacting on a driving portion due to transmission of a reactive force of the driving force of the linear motor of the reticle stage 73 to the wafer stage 93 and (2) of vibrating the projecting optical system 96.

The wafer stage 93 is scanned by the driving portion being synchronized with the reticle stage 73. During the scanning of the reticle stage 73 and the wafer stage 93, the positions of both stages are continuously sensed by interferometers 97 and 98, respectively, to be fed back to the driving portions of the recticle stage 73 and the wafer stage 93, respectively. This results in achieving precise synchronization of the starting position of scanning of both stages and control with high accuracy of the scanning speed in a constant scanning speed region, simultaneously.

According to a projection and exposure apparatus of this embodiment, there are the following advantages for achieving ultra high-performance exposure and transfer, since the single lens forming the projection optical system is fixed by the powder.

No deformation of the lens because of equally uniform holding.

High rigidity for maintaining the relative positions against vibration (acceleration) and external disturbance.

Release of the lens stress from expansion of the lens due to absorption of exposure energy, or emission of heat in the lens by conduction or convection.

No chemical reaction due to an exposure wavelength of the exposure light (excimer laser wavelength).

Figure 9:
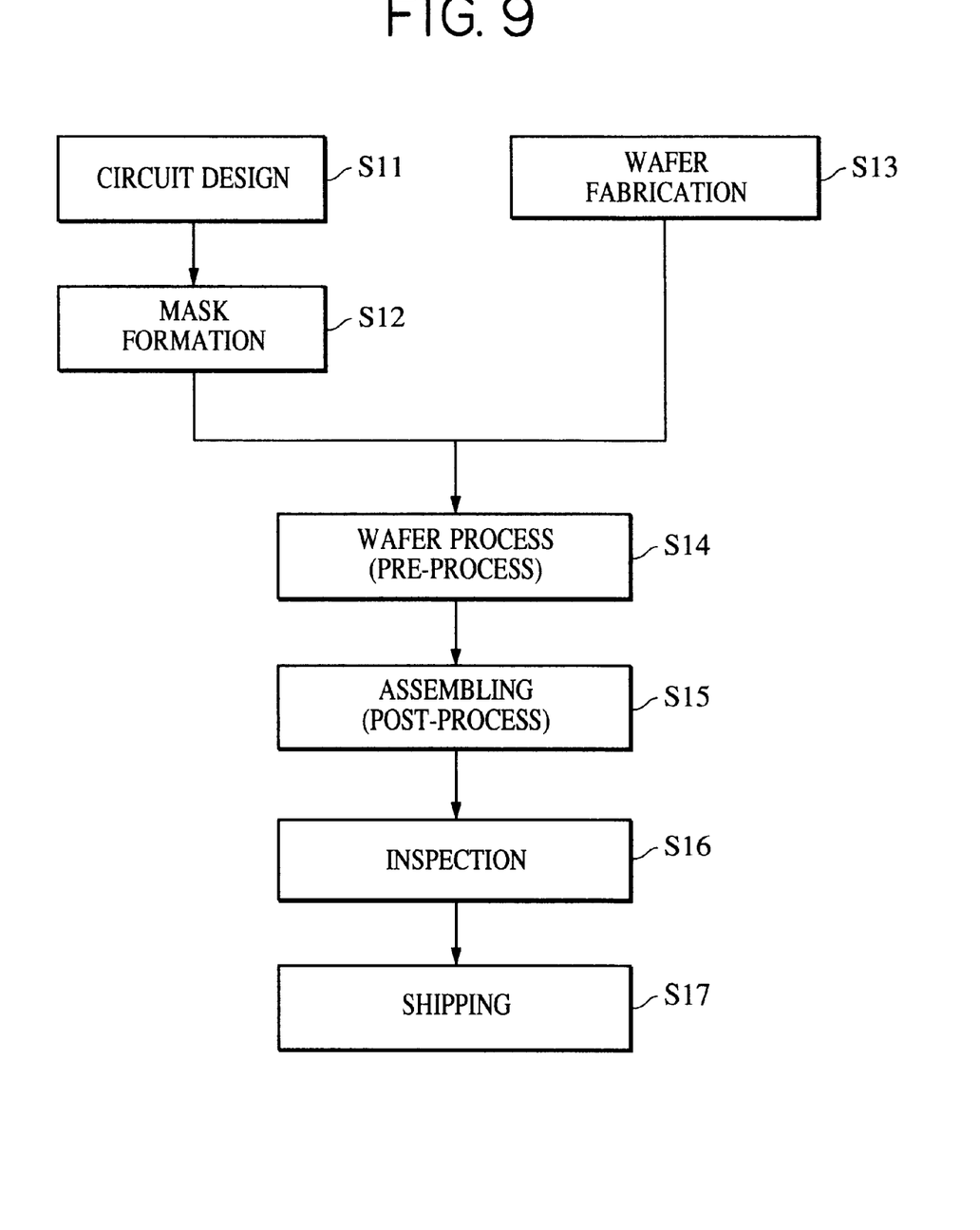
FIG. 9 is a block diagram of a method for manufacturing a semiconductor device of the present invention.

A method for manufacturing a device utilizing the aforementioned exposure apparatus will be described. FIG. 9 shows a flow chart of manufacturing a micro device (e.g., a semiconductor chip for an IC, an LSI, and the like, a liquid crystal panel, a CCD, a thin-film magnetic head, a micro machine, etc.). In Step 11 (circuit design), the pattern of the device is designed. In Step 12 (mask formation), a mask forming the designed pattern is formed. In Step 13 (wafer fabrication), a wafer is fabricated by utilizing materials such as silicon or glass. Step 14 (wafer process) is a pre-process in which an actual circuit is formed on the wafer by lithography utilizing the mask and wafer prepared as mentioned above. Step 15 (assembling) is a post-process, in which a semiconductor chip is formed by the wafer fabricated in Step 14, including an assembly process (dicing, bonding), and a packaging process (sealing of the chip), etc. In Step 16 (inspection), testing of the semiconductor device fabricated in Step 15, such as an operation test and an endurance test, is performed. Through these steps, the manufacturing of the semiconductor device is completed to then be shipped (Step 17).

Figure 10:
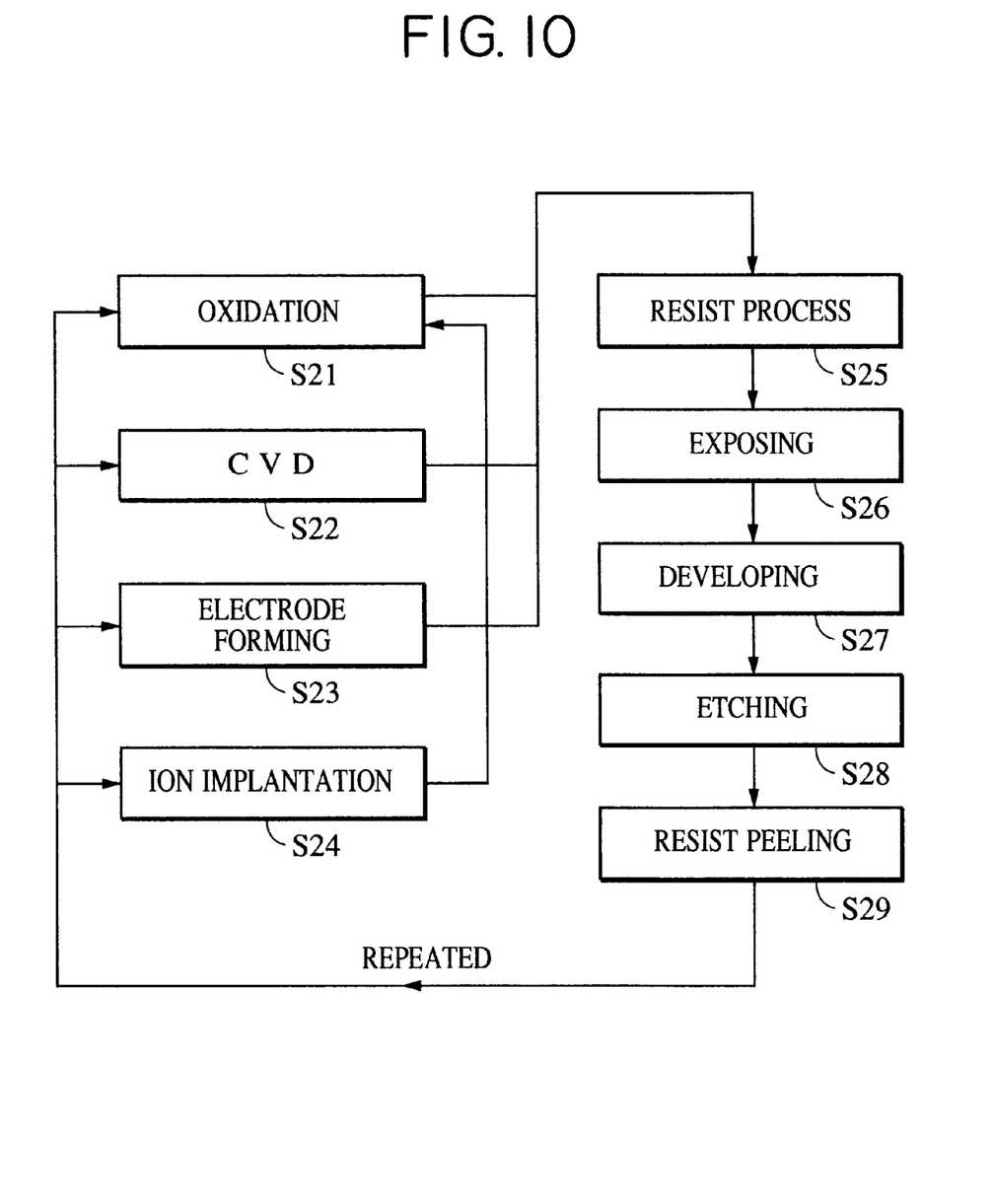
FIG. 10 is a detailed flow chart of a wafer process shown step S14 in FIG. 9.

FIG. 10 illustrates in detail the flow of the aforementioned wafer process. In Step 21 (oxidation), the surface of the wafer is oxidized. In Step 22 (CVD), an insulating film is formed on the surface of the wafer. In Step 23 (electrode forming), an electrode is formed on the wafer by evaporation. In Step 24 (ion implantation), ions are implanted in the wafer. In Step 25 (resist process), a resist is coated on the wafer. In Step 26 (exposing), a circuit pattern of the mask is placed in alignment with a plurality of shot regions on the wafer, and the wafer is exposed through the mask by means of the exposure apparatus described above. In Step 27 (developing), the exposed wafer is developed. In Step 28 (etching), the portions other than the developed resist image are cut off. In Step 29 (resist peeling), any unnecessary portions of the resist after etching are removed. By repetition of these steps, multiple circuit patterns are formed on the wafer. According to the method of this embodiment, a high-precision device can be produced, which otherwise has been difficult to produce by a conventional method.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An optical apparatus comprising:
    an optical member;
    a holding member for holding said optical member with a gap between said optical member and said holding member; and
    a powder charged in the gap between said optical member and said holding member such that the optical member and holding member are maintained in a space a part relationship.

2. An optical apparatus according to claim 1, wherein said optical member is one of a lens and a mirror.

3. An optical apparatus according to claim 1, wherein said powder comprises particles and an average diameter of the particles of said powder is larger than a maximum size of the gap between said optical member and said holding member.

4. An optical apparatus according to claim 1, wherein said optical member comprises concave-shaped recesses and said holding member comprises concave-shaped recesses, which oppose those of said optical member, and said powder is also charged in a space defined by said recesses.

5. An optical apparatus according to claim 1, wherein said optical member is circular-shaped and said holding member is ring-shaped.

6. An optical apparatus according to claim 1, wherein said powder contains particles of one of $SiO_2$ and $Al_2O_3$.

7. An optical apparatus according to claim 6, wherein said powder further contains silica beads.

8. An optical apparatus according to claim 7, wherein said powder comprises particles and an average diameter of the particles of said powder is larger than a maximum size of the gap between said optical member and said holding member.

9. A projection and exposure apparatus comprising:
    (i) an optical member,
    (ii) a holding member for holding said optical member with a gap between said optical member and said holding member; and
    (iii) a powder charged in the gap between said optical member and said holding member, such that said optical member and said holding member are maintained in a spaced-apart relationship.

10. A projection and exposure apparatus according to claim 9, wherein said optical member is one of a lens and a mirror.

11. A projection and exposure apparatus according to claim 9, wherein said powder comprises particles and an average diameter of the particles of said powder is larger than a maximum size of the gap between said optical member and said holding member.

12. A projection and exposure apparatus according to claim 9, wherein said optical member comprises concave-shaped recesses and said holding member comprises concave-shaped recesses, which oppose those of said optical member, and said powder is also charged in a space defined by said recesses.

13. A projection and exposure apparatus according to claim 9, wherein said optical member is circular-shaped and said holding member is ring-shaped.

14. A projection and exposure apparatus according to claim 9, wherein said powder contains particles of one of $SiO_2$ and $Al_2O_3$.

15. A projection and exposure apparatus according to claim 14, wherein said powder further contains silica beads.

16. A projection and exposure apparatus according to claim 15, wherein said powder comprises particles and an average meter of the particles of said powder is larger than a maximum size of the gap between said optical member and said holding member.

* * * * *

UNITED STATES PATENT AND TRADEMARK OFFICE
CERTIFICATE OF CORRECTION

PATENT NO. : 6,144,504
DATED : November 7, 2000
INVENTOR : YUJI SUDOH, ET AL.

It is certified that error appears in the above-identified patent and that said Letters Patent is hereby corrected as shown below:

COLUMN 1:
Line 67, "coordinates" should read --coordinate--.

COLUMN 2:
Line 38, "Inner" should read --inner--.

COLUMN 7:
Line 57, "SIO$_2$" should read --SiO$_2$--.

COLUMN 8:
Line 56, "apparutus" should read --apparatus--.

COLUMN 10:
Line 35, "member" (1$^{st}$ occurrence) should read --member,--.
Line 36, "space a part" should read --spaced apart--.

COLUMN 12:
Line 11, "meter" should read --diameter--.

Signed and Sealed this

Twenty-ninth Day of May, 2001

Attest:

NICHOLAS P. GODICI

Attesting Officer    Acting Director of the United States Patent and Trademark Office